(12) United States Patent
Moon et al.

(10) Patent No.: US 8,275,154 B2
(45) Date of Patent: Sep. 25, 2012

(54) APPARATUS FOR PROCESSING AN AUDIO SIGNAL AND METHOD THEREOF

(75) Inventors: Jong Ha Moon, Seoul (KR); Hyen O Oh, Seoul (KR); Joon Il Lee, Seoul (KR); Myung Hoon Lee, Seoul (KR); Yang Won Jung, Seoul (KR); Alexis Favrot, Biberstein (CH); Christof Faller, St-Sulpice (CH)

(73) Assignee: LG Electronics Inc., Seoul (KR)

( * ) Notice: Subject to any disclaimer, the term of this patent is extended or adjusted under 35 U.S.C. 154(b) by 534 days.

(21) Appl. No.: 12/511,669

(22) Filed: Jul. 29, 2009

(65) Prior Publication Data

US 2010/0085117 A1  Apr. 8, 2010

Related U.S. Application Data

(60) Provisional application No. 61/084,265, filed on Jul. 29, 2008, provisional application No. 61/158,388, filed on Mar. 8, 2009, provisional application No. 61/164,459, filed on Mar. 29, 2009.

(51) Int. Cl.
*H03G 3/00* (2006.01)

(52) U.S. Cl. ...... 381/108; 381/104; 381/107; 381/94.1; 381/94.2; 381/94.3; 704/233; 704/226; 704/234

(58) Field of Classification Search ............. 381/83, 381/93, 96, 104–109, 94.1–94.3, 74.1–74.3; 704/226, 233, 234

See application file for complete search history.

(56) References Cited

U.S. PATENT DOCUMENTS

| | | | |
|---|---|---|---|
| 4,490,843 A | 12/1984 | Bose et al. | |
| 4,739,514 A | 4/1988 | Short et al. | |
| 5,768,473 A * | 6/1998 | Eatwell et al. | ............... 704/226 |
| 6,122,384 A | 9/2000 | Mauro | |
| 6,965,676 B1 | 11/2005 | Allred | |
| 2001/0022812 A1 | 9/2001 | Ise et al. | |
| 2005/0096762 A2 | 5/2005 | Claesson | |
| 2005/0228651 A1 | 10/2005 | Wang et al. | |
| 2006/0106472 A1 | 5/2006 | Romesburg et al. | |
| 2007/0124139 A1 | 5/2007 | Chen | |
| 2008/0253586 A1 | 10/2008 | Wei | |

FOREIGN PATENT DOCUMENTS

| | | |
|---|---|---|
| DE | 3321225 C2 | 10/1997 |
| EP | 1729287 A1 | 12/2006 |
| EP | 1835487 A2 | 9/2007 |
| WO | WO 94/23419 A1 | 10/1994 |
| WO | WO-96/24127 A1 | 8/1996 |
| WO | WO-97/11572 A1 | 3/1997 |
| WO | 02/21687 A2 | 3/2002 |
| WO | WO-2005/036922 A1 | 4/2005 |
| WO | 2006/106479 A2 | 10/2006 |
| WO | WO 2006/111370 A1 | 10/2006 |
| WO | WO 2008/155708 A1 | 12/2008 |

\* cited by examiner

*Primary Examiner* — Disler Paul

(74) *Attorney, Agent, or Firm* — Birch, Stewart, Kolasch & Birch, LLP

(57) ABSTRACT

An apparatus for processing an audio signal and method thereof are disclosed, by which a local dynamic range of an audio signal can be adaptively normalized as well as a maximum dynamic range of the audio signal. The present invention includes receiving, by an audio processing apparatus, a signal, and feedback information estimated based on a normalizing gain; generating a noise estimation based on the signal; computing a gain filter for noise canceling, based on the noise estimation and the signal; and, obtaining a restricted gain filter by applying the feedback information to the gain filter.

9 Claims, 12 Drawing Sheets

(A)

(B)

(A)

(B)

APPARATUS FOR PROCESSING AN AUDIO SIGNAL AND METHOD THEREOF

CROSS-REFERENCE TO RELATED APPLICATION

This application claims the benefit of U.S. Provisional Application No. 61/084,265 filed on Jul. 29, 2008, U.S. Provisional Application No. 61/158,388, filed on Mar. 8, 2009, U.S. Provisional Application No. 61/164,459, filed on Mar. 29, 2009, which are hereby incorporated by reference.

BACKGROUND OF THE INVENTION

1. Field of the Invention

The present invention relates to an apparatus for processing an audio signal and method thereof. Although the present invention is suitable for a wide scope of applications, it is particularly suitable for processing audio signals.

2. Discussion of the Related Art

Generally, an audio signal is outputted via a loud speaker of a television or a portable device, a headset or the like. Before the audio signal is outputted via a speaker or the like, an audio processor is able to perform noise canceling, normalizing, volume adjustment functions and the like to the audio signal.

However, in the related art, such processing as noise canceling, normalizing and the like is performed individually and independently. Moreover, when an audio content varies widely (e.g., zapping between TV channels or radio channels (several songs) is performed), normalizing may not be performed according to a characteristic of the audio content.

Moreover, since noise varies rapidly when volume goes up or down, a listener may hear how a normalizer of a background noise adjusts the volume.

SUMMARY OF THE INVENTION

Accordingly, the present invention is directed to an apparatus for processing an audio signal and method thereof that substantially obviate one or more of the problems due to limitations and disadvantages of the related art.

An object of the present invention is to provide an apparatus for processing an audio signal and method thereof, by adaptively normalizing a local dynamic range as well as a maximum dynamic range of an audio signal.

Another object of the present invention is to provide an apparatus for processing an audio signal and method thereof, by which an extent of noise canceling can be adjusted according to an extent of normalizing.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a method for processing an audio signal includes receiving a signal, by an audio processing apparatus; computing a long-term power and a short-term power by estimating power of the signal; generating a slow gain based on the long-term power; generating a fast gain based on the short-term power; obtaining a final gain by combining the slow gain and the fast gain; and, modifying the signal using the final gain.

Preferably, the final gain is generated by multiplying the slow gain by the fast gain.

Preferably, the fast gain is generated using at least one of a limiter threshold, a compressor threshold, and an expander threshold.

Preferably, the slow gain and the fast gain are generated by being smoothed over time, and wherein the slow gain and the fast gain are within a limit range.

Preferably, the slow gain, the fast gain and the final gain correspond to a full-band gain.

Preferably, the slow gain and the fast gain are generated using a target level value included in at least one of user input information and device setting information.

Preferably, the method further comprises generating a feedback information using the final gain. In this case, the feedback information limit is associated with at least one of a minimum value and a maximum value of gain filter for noise canceling.

To further achieve these and other advantages and in accordance with the purpose of the present invention, an apparatus for processing an audio signal includes a power estimating part computing a long-term power and a short-term power by estimating power of a signal; a slow gain generating part generating a slow gain based on the long-term power; a fast gain generating part generating a fast gain based on the short-term power; a final gain obtaining part obtaining a final gain by combining the slow gain and the fast gain; and, an output signal generating part modifying the signal using the final gain.

Preferably, the final gain is generated by multiplying the slow gain by the fast gain.

Preferably, the fast gain is generated using at least one of a limiter threshold, a compressor threshold, and an expander threshold.

Preferably, the slow gain and the fast gain are generated by being smoothed over time, and wherein the slow gain and the fast gain are within a limit range.

Preferably, the slow gain, the fast gain and the final gain correspond to a full-band gain.

Preferably, the slow gain and the fast gain are generated using a target level value included in at least one of user input information and device setting information.

Preferably, the apparatus further comprises a feedback information generating part generating feedback information using the final gain. In this case, the feedback information is associated with at least one of a minimum value and a maximum value of gain filter for noise canceling.

To further achieve these and other advantages and in accordance with the purpose of the present invention, a computer-readable medium having instructions stored thereon, which, when executed by a processor, causes the processor to perform operations, includes receiving a signal, by an audio processing apparatus; computing a long-term power and a short-term power by estimating power of the signal; generating a slow gain based on the long-term power; generating a fast gain based on the short-term power; obtaining a final gain by combining the slow gain and the fast gain; and, modifying the signal using the final gain.

To further achieve these and other advantages and in accordance with the purpose of the present invention, a method for processing an audio signal includes receiving, by an audio processing apparatus, a signal, and feedback information estimated based on a normalizing gain; generating a noise estimation based on the signal; computing a gain filter for noise canceling, based on the noise estimation and the signal; and, obtaining a restricted gain filter by applying the feedback information to the gain filter.

Preferably, the method further comprises generating an output signal by applying the restricted gain filter to the signal. In this case, the normalizing gain is generated based on the output signal and a target level value.

Preferably, the gain filter is a time-frequency-variant value associated with a relative proportion of a noise signal in the signal.

Preferably, the gain filter and the noise signal are in inverse proportion to each other.

Preferably, the normalizing gain corresponds to a combination of a slow gain and a fast gain. In this case, the slow gain corresponds to a gain for controlling a maximum dynamic range of the signal, and, the fast gain corresponds to a gain for controlling a local dynamic range of the signal.

To further achieve these and other advantages and in accordance with the purpose of the present invention, an apparatus for processing an audio signal includes a noise detecting part generating a noise estimation based on a signal; and, a gain filter computing part computing a gain filter for noise canceling, based on the noise estimation and the signal, a gain filter computing part obtaining a restricted gain filter by applying feedback information to the gain filter, wherein the feedback information is received from normalizing part, wherein the feedback information is estimated based on a normalizing gain.

Preferably, the apparatus further comprises a multifier generating an output signal by applying the restricted gain filter to the signal. In this case, the normalizing gain is generated based on the output signal and a target level value.

Preferably, the gain filter is a time-frequency-variant value associated with a relative proportion of a noise signal in the signal.

Preferably, the gain filter and the noise signal are in inverse proportion to each other.

Preferably, the normalizing gain corresponds to a combination of a slow gain and a fast gain. In this case, the slow gain corresponds to a gain for controlling a maximum dynamic range of the signal, and, the fast gain corresponds to a gain for controlling a local dynamic range of the signal.

To further achieve these and other advantages and in accordance with the purpose of the present invention, a computer-readable medium having instructions stored thereon, which, when executed by a processor, causes the processor to perform operations, includes receiving, by an audio processing apparatus, a signal, and feedback information estimated based on a normalizing gain; generating a noise estimation based on the signal; computing a gain filter for noise canceling, based on the noise estimation and the signal; and, generating a restricted gain filter by applying the feedback information to the gain filter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings. First of all, terminologies or words used in this specification and claims are not construed as limited to the general or dictionary meanings and should be construed as the meanings and concepts matching the technical idea of the present invention based on the principle that an inventor is able to appropriately define the concepts of the terminologies to describe the inventor's invention in best way. The embodiment disclosed in this disclosure and configurations shown in the accompanying drawings are just one preferred embodiment and do not represent all technical idea of the present invention. Therefore, it is understood that the present invention covers the modifications and variations of this invention provided they come within the scope of the appended claims and their equivalents at the timing point of filing this application.

The following terminologies in the present invention can be construed based on the following criteria and other terminologies failing to be explained can be construed according to the following purposes. First of all, it is understood that the concept 'coding' in the present invention includes both encoding and decoding. Secondly, 'information' in this disclosure is the terminology that generally includes values, parameters, coefficients, elements and the like and its meaning can be construed as different occasionally, by which the present invention is non-limited.

In this disclosure, in a broad sense, an audio signal is conceptionally discriminated from a video signal and designates all kinds of signals that can be auditorily identified. In a narrow sense, the audio signal means a signal having none or small quantity of speech characteristics. Audio signal of the present invention should be construed in a broad sense. And, the audio signal of the present invention can be understood as a narrow-sense audio signal in case of being used by being discriminated from a speech signal.

Figure 1:
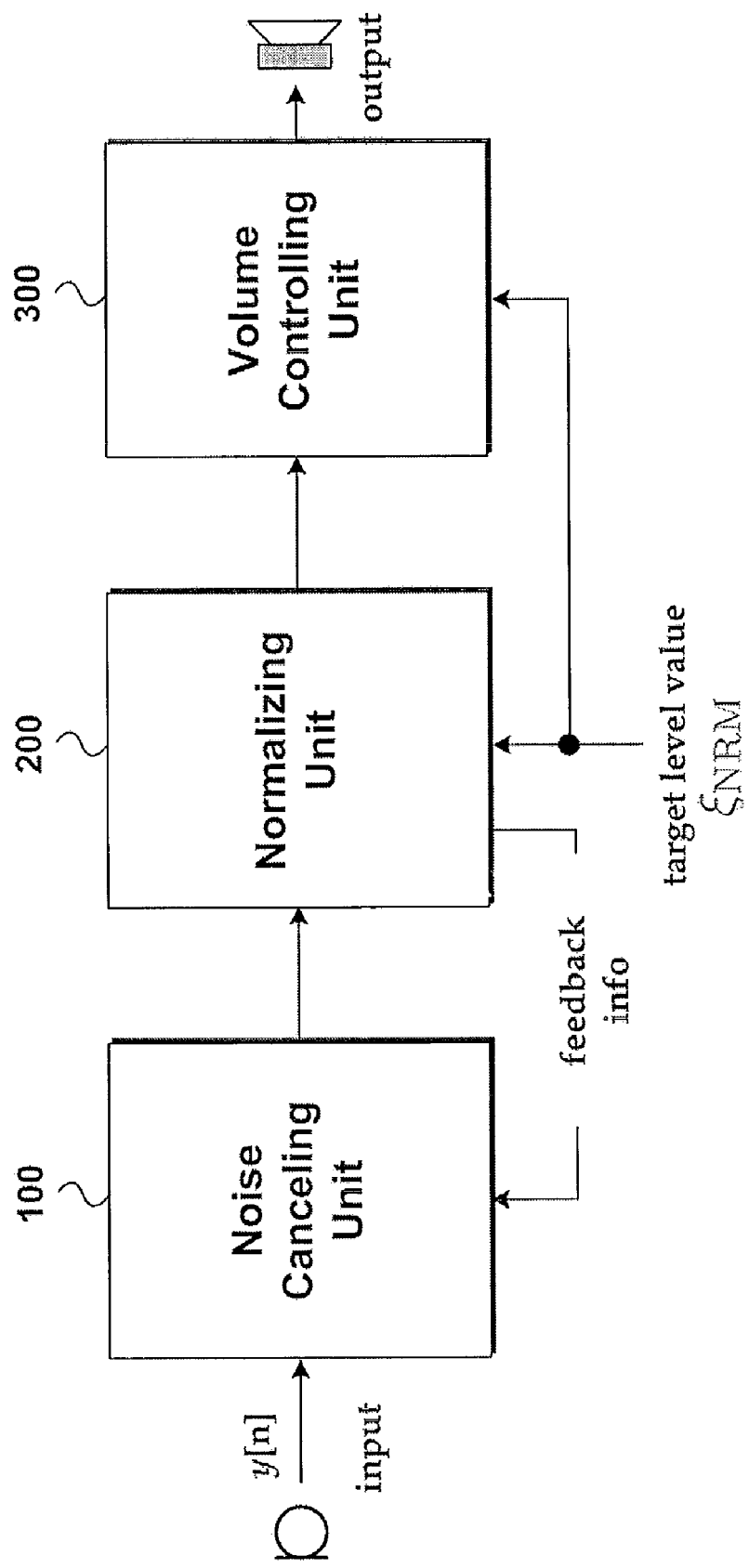
FIG. 1 is a block diagram of an audio signal processing apparatus according to an embodiment of the present invention.

FIG. 1 is a block diagram of an audio signal processing apparatus according to an embodiment of the present invention.

Referring to FIG. 1, an audio signal processing apparatus includes a noise canceling unit 100 and a normalizing unit 200 and may further include a volume controlling unit 300.

The noise canceling unit 100 detects or estimates a noise included in an audio signal for an input audio signal y[n], determines a per-time per-frequency gain based on an relative proportion of the noise, and then applies the determined gain to the audio signal. In determining the gain, it is able to use feedback information outputted from the normalizing unit 200. The noise canceling unit 100 will be described in detail with reference to FIG. 2 later.

The normalizing unit 200 is able to adaptively control a maximum dynamic range and local dynamic range of an input signal by performing normalizing on the input audio signal y[n] or a signal processed by the noise canceling unit, based on a target level value. The normalizing unit 200 will be explained in detail with reference to FIGS. 3 to 6 later. In this case, the target level value is an information inputted by a user or an device setting information and may correspond to a full-band gain (e.g., 10 dB irrespective of a frequency band).

And, the volume controlling unit 300 controls a volume for the normalized audio signal based on the target level value.

Figure 2:
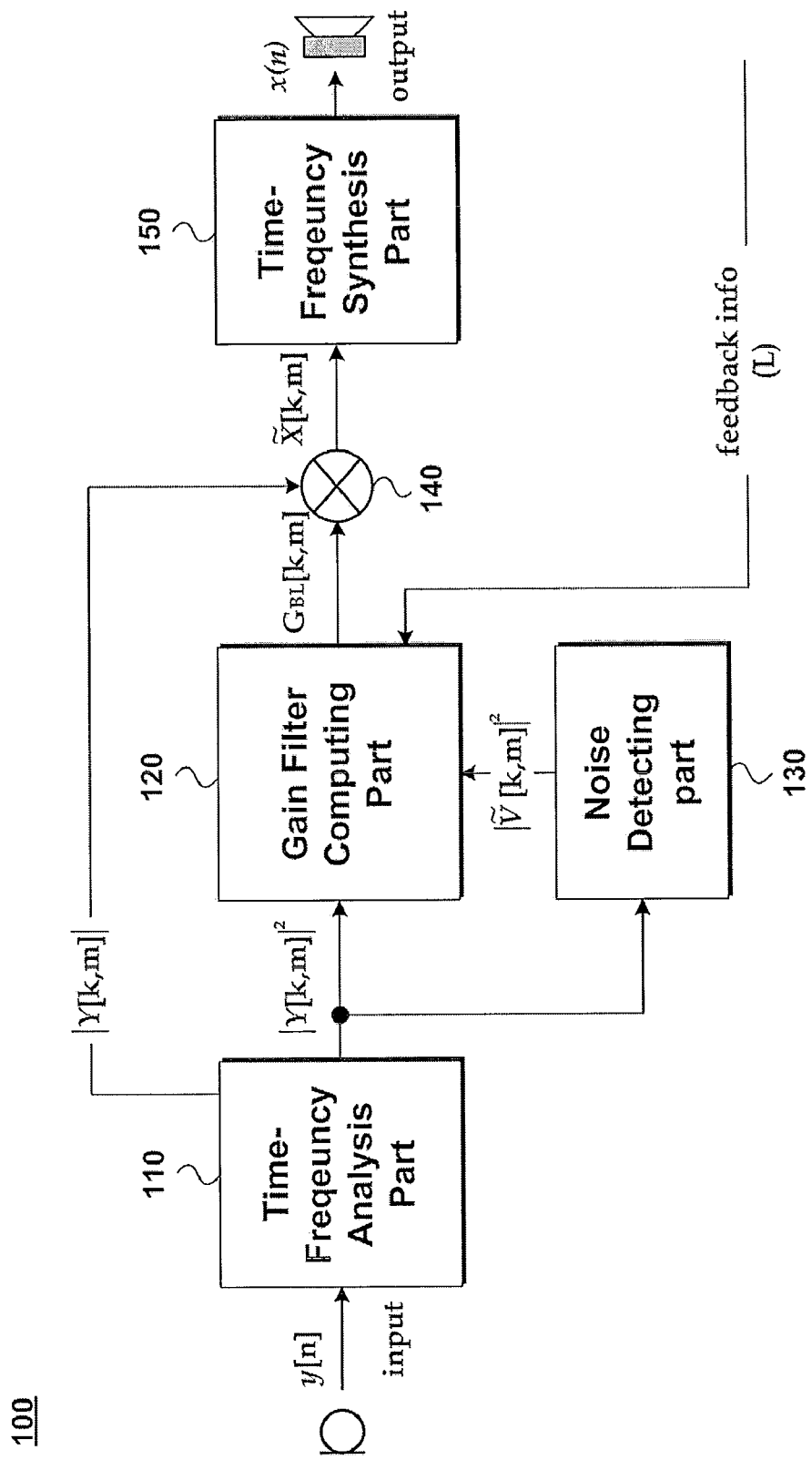
FIG. 2 is a detailed block diagram of a noise canceling unit shown in FIG. 1.

FIG. 2 is a detailed block diagram of a noise canceling unit shown in FIG. 1.

Referring to FIG. 2, the noise canceling unit 100 can include a time-frequency analysis part 110, a gain filter computing part 120, a noise detecting part 130 and a time-frequency synthesis part 140.

First of all, an input audio signal y[n] is assumed as the following formula.

$$y[n]=x[n]+v[n] \quad \text{[Formula 1]}$$

In Formula 1, y[n] is an input signal, x[n] is a desired signal or a clean signal, v[n] is a noise signal, and 'n' indicates a time index.

The time-frequency analysis part 100 performs a time-frequency analysis on an input audio signal. Meanwhile, the time-frequency analysis can be performed by short-time Fourier transform (STFT) or can be performed by a filterbank or another time-frequency transform, by which the present invention is non-limited. In case that the time-frequency analysis is performed, Formula 1 can be represented as the following formula.

$$Y[k,m]=X[k,m]+V[k,m] \quad \text{[Formula 2]}$$

In this case, 'k' indicates a time frame number and 'm' indicates a frequency bin index.

As human perception is relatively insensitive to phase corruption, an estimated phase can be chosen to be equal to the noisy phase. In this case, an estimation of |X[k,m]| is sufficient to recover a desired speech signal or a desired audio signal. Within a single processing frame, a speech signal x and a noise signal v can be modeled by an uncorrelated stationary process. This is represented as the following formula. If the modeling is performed by this formula, it is able to reconstruct a power spectrum $|X[k,m]|^2$ of a desired signal or a clean signal by subtracting an estimation $|\tilde{V}[k,m]|^2$ of a power spectrum of a noise signal from $|Y[k,m]|^2$. According to the analogy with Wiener filtering, a spectral magnitude of a clean signal can be reconstructed by the following formula.

$$|\tilde{X}[k,m]|=G[k,m]|Y[k,m]| \quad \text{[Formula 3]}$$

In the above formula, a gain filter can be expressed as follows.

$$G_B[k,m] = \frac{|Y[k,m]|^2 - \beta|\tilde{V}[k,m]|^2}{|Y[k,m]|^2} \quad \text{[Formula 4]}$$

In case of under or over estimation, the β is a parameter to control amount of noise to be suppressed. This parameter can be selected in association with a signal to noise ratio (SNR) and a frequency index m.

The noise detecting part 130 detects noise for an input signal and then generates a noise estimation $|\tilde{V}[k,m]|^2$. This noise is such a signal as a white noise and the like. This noise can be detected in various ways. In case of a noise signal, it may be a signal failing to have self-correlation of a signal and inter-channel correlation of a signal. Hence, when tonality and inter-channel correlation of an input signal are measured, if theses values are lost, it is able to determine that it is a noise. Yet, the present invention is non-limited by a method of detecting a noise.

The gain filter computing part 130 computes a gain filter $G_B[k,m]$ for noise canceling based on the input signal and the noise estimated value and then generates a restricted gain filter $G_{BL}[k,m]$ by applying feedback information including attenuation limit value to the computed gain. In this case, the gain filter may be equal to the expression of Formula 4. The gain $G_B[k,m]$ indicates an extent of the noise estimated value $|\tilde{V}[k,m]|^2$ included per time-frequency band, compared to $|Y[k,m]|^2$. In other words, the gain filter is a time-frequency-variant value associated with a relative proportion of a noise signal in the signal. The gain filter and the noise signal are in inverse proportion to each other. If a relative ratio of a noise estimated value is high, a gain becomes a low value. If a relative ratio of a noise estimated value is low, a gain becomes a high value. Namely, a power |Y[k,m]| of an input signal is lowered by applying a low gain to a time-frequency band determined to include a large quantity of noise. On the contrary, a power |Y[k,m]| of an input signal is raised by applying a high gain to a time-frequency band determined to include a small quantity of noise.

Meanwhile, in order to prevent musical-like noise artifacts (i.e., in order to prevent a problem that noise is excessively canceled if noise is similar to music), the gain filter defined in Formula 4 is smoothed over time and is restricted not to become smaller than L dB. The attenuation include in the feedback information may correspond to maximum value or minimum value of gain filter, which is time-variant. This is represented as the following formula.

$$G_{BL}[k,m] = \max\{10^{\frac{L}{20}} \cdot G_B\} \quad \text{[Formula 5]}$$

In Formula 5, $G_B$ indicates a gain filter defined in Formula 4 and 'L' indicates an attenuation limit value [dB], $G_{BL}$ indicates a restricted gain filter.

In particular, since a gain G is impossible to be smaller than a value L (exactly, $10^{L/20}$), the L is a lower limit of the gain G. By applying the attenuation limit, it is able to prevent a power of an input signal from being excessively lowered as a too-low gain is applied.

Meanwhile, an attenuation limit value (attenuation limit information) is a value that varies according to a frequency band. And, the attenuation limit value can be determined based on the feedback information including the attenuation limit information received from a normalizing unit 200, which will be explained later. In case that an input signal is normalized after the noise canceling, this attenuation limit information is provided to use a feedback for a gain control in the normalizing step in canceling a noise. For instance, if a low gain is applied in normalizing, a power of an input signal is not excessively reduced in the noise canceling step. The feedback information including attenuation limit information will be explained in detail together with the description of the normalizing unit 200 later.

A multiplier 140 generates an estimation of a clean signal (or a desired signal) resulting from removing a noise from an input signal, as represented in Formula 3, by applying the gain determined by the gain filter computing part 120 to the input signal. The time-frequency synthesis part 150 generates a clean signal in time domain by performing a time-frequency synthesis on the clean signal.

Figure 3:
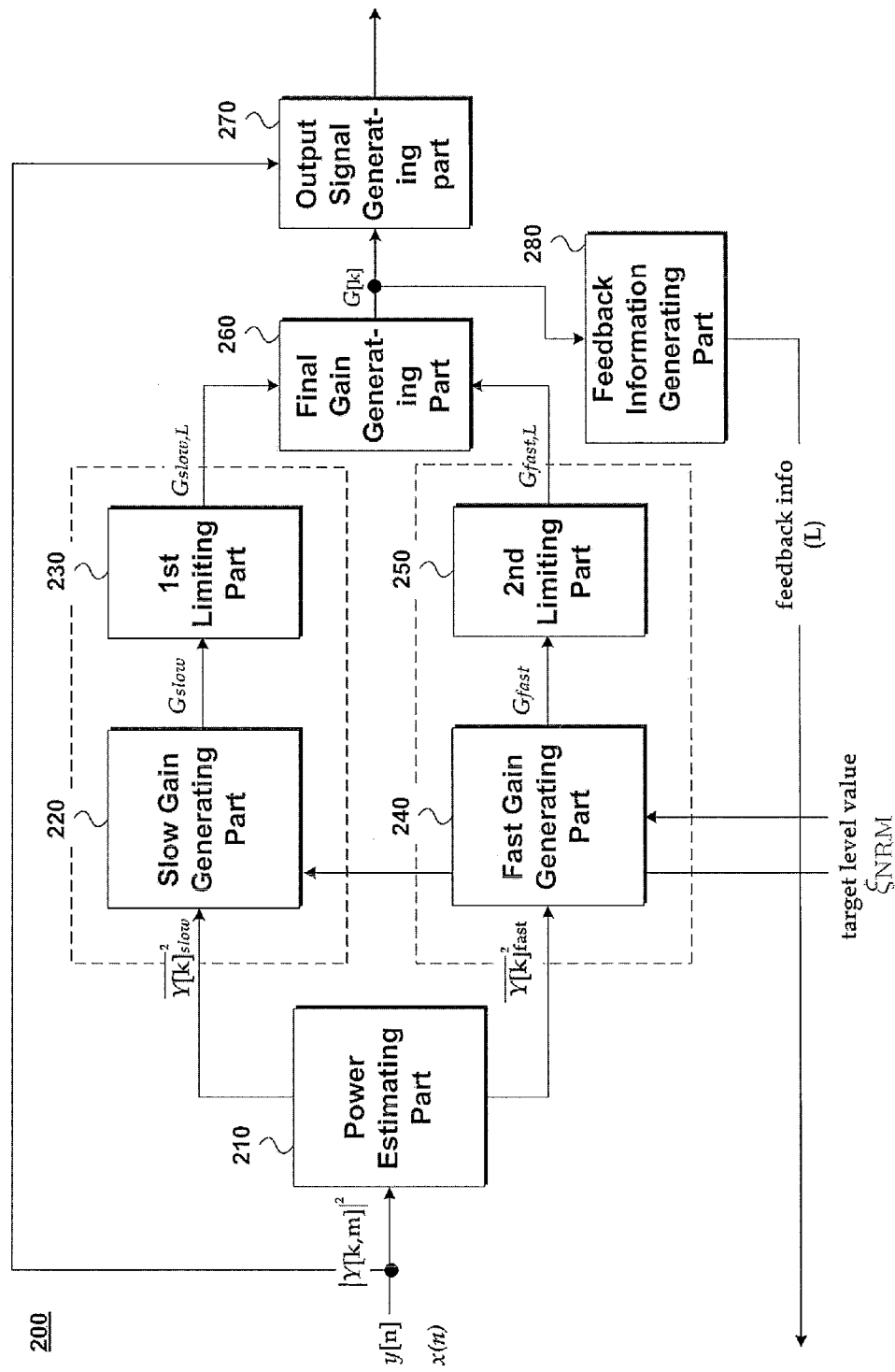
FIG. 3 is a detailed block diagram of a normalizing unit shown in FIG. 2.

FIG. 3 is a detailed block diagram of a normalizing unit shown in FIG. 2.

Referring to FIG. 3, a normalizing unit 200 is a unit configured to normalize a clean signal generated by a noise canceling unit 100 from canceling a noise of an input signal. An input signal of the normalizing unit 200 can be an output x(n) of the noise canceling unit and will be expressed as y[n] for convenience.

The normalizing unit 200 adaptively controls a dynamic range of an audio signal mainly in two ways. First of all, the normalizing unit 200 controls a maximum dynamic range of an input signal by performing slow adaptation. Secondly, the normalizing unit 200 controls a local dynamic range of an input signal by performing fast adaptation. Details will be described together with the respective elements.

Meanwhile, a gain applied by the normalizing unit, i.e., a normalizing gain can be defined as a full-band gain shown in the following formula.

$$Z[k,m]=G[k]Y[k,m] \quad \text{[Formula 6]}$$

In Formula 6, Y[k,m] is a frequency transformed input signal, Z[k,m] is a frequency transformed output signal through a normalizing unit, G[k] is a normalizing gain, k is a time frame number, and m is a frequency bin index.

In particular, G[k] is a time-variant value irrespective of a frequency band. Meanwhile, the frequency transform can include a short-time Fourier transform (STFT), by which the present invention is non-limited.

First of all, a power estimating part 210 performs a frequency transform on an input signal and then computes an instantaneous power of the input signal by summing a power per frequency band m at a specific timing point k, as shown in the following formula. Of course, the power estimating part 210 can receive a frequency transformed signal without performing the frequency transform by itself, as shown in the drawing.

$$\overline{Y[k]}^2 = \sum_m |Y[k,m]|^2 \quad \text{[Formula 7]}$$

In Formula 7, Y[k,m] is a frequency transformed input signal, k is a time frame number, and m is a frequency bin index.

Since it is attempted to find a full band gain G[k] to be applied by the normalizing unit, the instantaneous power is calculated by the above formula. By the above formula, a long-term power $\overline{Y[k]}_{slow}^2$ can be calculated using a single pole averaging filter having a small attack time constant and a large release time constant. The long-term power may correspond to a maximum dynamic range estimator. On the other hand, a short-term power $\overline{Y[k]}_{fast}^2$ can be calculated using a small release time constant. The short-term power may correspond to a local dynamic range estimator. The $\overline{Y[k]}_{slow}^2$ is transferred to a slow gain generating part 220 and the $\overline{Y[k]}_{fast}^2$ is transferred to a fast gain generating part 240.

The slow gain generating part 220 generates a slow gain based on the long-term power $\overline{Y[k]}_{slow}^2$ received from the power estimating part 210. The slow gain can be defined by the following formula.

$$G_{slow}[k] = \frac{\xi_{NRM}}{\overline{Y[k]}_{slow}^2} \quad \text{[Formula 8]}$$

In Formula 8, $\xi$NRM is a target level value, $G_{slow}$[k] is a slow gain, and $\overline{Y[k]}_{slow}^2$ is a long-term power.

Referring to the above formula, the slow gain generating part 220 is provided to simply apply the long-term power $\overline{Y[k]}_{slow}^2$ to the target level value $\xi$NRM. Meanwhile, the target level value may be the information inputted by a user or device setting information. For instance, in case that a user inputs 10 dB as a target level value, a slow gain is provided to control a range of an input signal not to deviate from 10 dB mostly.

Meanwhile, the slow gain $G_{slow}$[k] by Formula 8 can be smoothed over time to avoid high variation artifacts. As a result of the smoothing, it is able to center a signal into the target level value.

The fast gain generating part 240 generates a fast gain $\langle G_{fast}[k]\rangle_{dB}$ based on the short-term power $\overline{Y[k]}_{fast}^2$. The fast gain enables the normalizing unit to fast adapt to a dynamic range of a signal by acting like an expander, a compressor or a limiter. The fast gain is provided to generate a level $\langle \overline{Z[k]}^2\rangle_{dB}$ of an output signal.

$$\langle \overline{Z[k]}^2\rangle_{dB} = \begin{cases} CT - \tan\beta_C(CT - LT) & \text{if } LT \le \langle \overline{Y[k]}_{fast}^2\rangle_{dB} \\ CT - \tan\beta_C(\langle \overline{Y[k]}_{fast}^2\rangle_{dB} - CT) & \text{if } CT \le \langle \overline{Y[k]}_{fast}^2\rangle_{dB} < LT \\ ET - \tan\beta_E(\langle \overline{Y[k]}_{fast}^2\rangle_{dB} - ET) & \text{if } \langle \overline{Y[k]}_{fast}^2\rangle_{dB} < CT. \end{cases} \quad \text{[Formula 9]}$$

In Formula 9, $\langle \overline{Z[k]}^2\rangle_{dB}$ is a level of an output signal, LT is a limiter threshold, CT is a compressor threshold, ET is an expander threshold, $\langle \overline{Y[k]}_{fast}^2\rangle_{dB}$ is a level of an input signal, $\beta_C$ is a compression strength, and $\beta_E$ is an expander strength.

Figure 4:
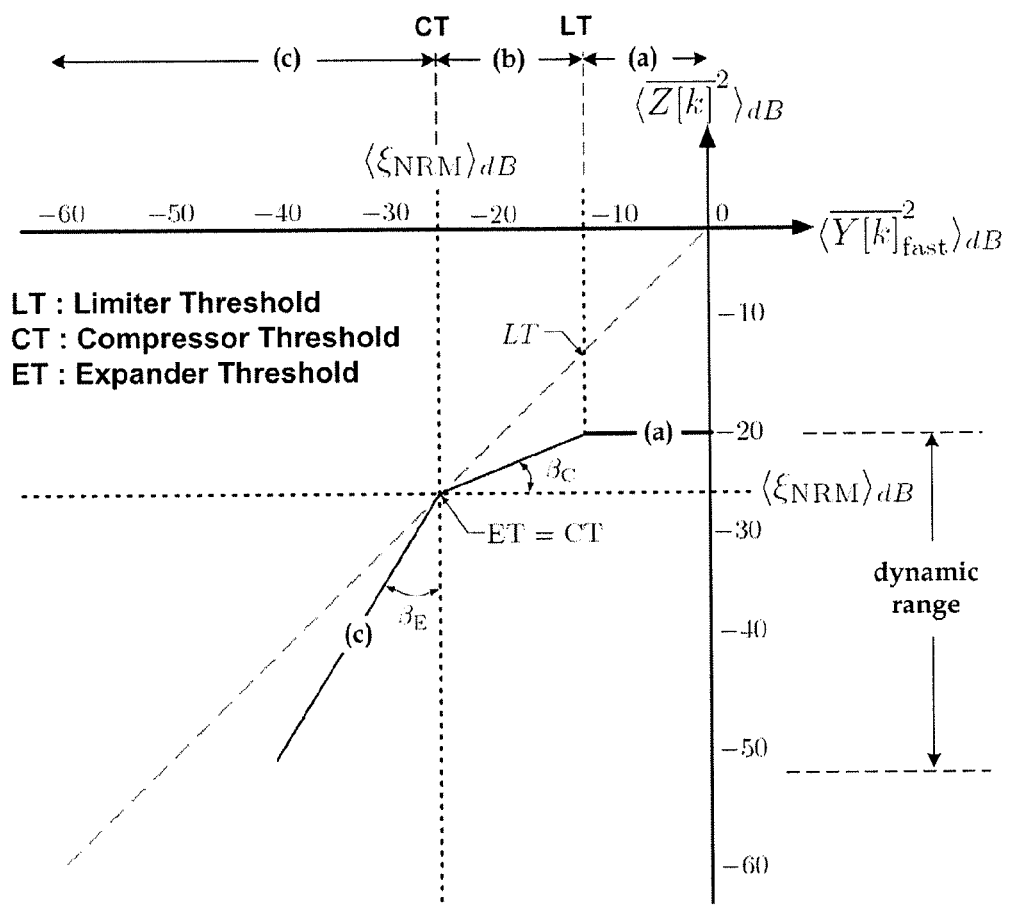
FIG. 4 is a diagram for explaining a function of a fast gain generating part shown in FIG. 3.

FIG. 4 is a diagram for explaining a function of a fast gain generating part shown in FIG. 3, in which a relation between levels of input and output signals represented as Formula 9 is shown.

Referring to FIG. 4, a horizontal axis indicates a level of an input signal and a vertical axis indicates a level of an output signal. The horizontal axis is divided into a region (a) in which a level of an input signal is greater than LT, a region (b) in which a level of an input signal is between LT and CT, and a region (c) in which a level of an input signal is smaller than CT. In this case, even if an input signal is equal to or greater than LT, it is limited to LT in the region (a) [corresponding to a first line in Formula 9]. In the region (b) [corresponding to a second line in Formula 9], a slope varies according to a compression strength $\beta_C$. And, a level of an output signal is adjusted according to this slope. For instance, if a level of an input signal is −10 dB, a level of an output signal becomes −20 dB. If a level of an input signal is −20 dB, a level of an output signal can become −25 dB. In the region (c) [corresponding to a third line in Formula 9], a level of an output signal becomes greater than that of an input signal according to an expander strength $\beta_E$. For instance, if a level of an input signal is −50 dB, a level of an output signal can become −45 dB. As functions of a limiter, compressor and expander are performed in the regions (a), (b) and (c), respectively, fast normalizing is performed in a manner of increasing a small signal and decreasing a large signal. For instance, a dynamic range of an output signal can range from negative infinity to a level (e.g., −20 dB) of an output signal corresponding to a case that an input signal is LT.

Thus, in order to obtain an output signal shown in Formula 9 and FIG. 4, it is able to apply a fast gain defined in the following formula to an input signal. In this case, the calculation of the fast gain can be performed by a simple line equation in a logarithmic domain.

$$\begin{cases} -(\langle \overline{Y[k]}^2_{fast}\rangle_{dB} - LT) + CS(CT - LT) & \text{if } LT \leq \langle \overline{Y[k]}^2_{fast}\rangle_{dB} \\ -CS(\langle \overline{Y[k]}^2_{fast}\rangle_{dB} - CT) & \text{if } CT \leq \langle \overline{Y[k]}^2_{fast}\rangle_{dB} < LT \\ -ES(\langle \overline{Y[k]}^2_{fast}\rangle_{dB} - ET) & \text{if } \langle \overline{Y[k]}^2_{fast}\rangle_{dB} < CT. \end{cases}$$ [Formula 10]

In Formula 10, $\langle \overline{Y[k]}_{fast}^2 \rangle_{dB}$ is a level of an input signal. CS is a slope factor of compression and CS=1−tan $\beta_C$. ES is a slope factor of an expander and ES=1−tan $\beta_E$.

Like Formula 9, a first line in Formula 10 corresponds to a case that an input signal is greater than LT. A second line indicates a case that an input signal is between CT and LT. And, a third line indicates a case that an input signal is smaller than CT.

After the fast gain represented as Formula 10 has been obtained, the fast gain can be smoothed in time direction to prevent high variation artifacts like the slow gain.

Thus, the slow gain and the fast gain, which are generated by the slow gain generating part 220 and the fast gain generating part 240 can be limited within a reasonable range by limiting parts 230 and 250, respectively.

The first limiting part 230 can generate a limited slow gain $G_{slow,L}$ shown in the following formula.

$$\langle G_{slow,L}[k]\rangle_{dB} = \max\{\min\{\langle G_{slow}[k]\rangle_{dB}, L_{slow}\}, -L_{slow}\}$$ [Formula 11]

In Formula 11, $\langle G_{slow,L}[k]\rangle_{dB}$ is a limited fast gain, $\langle G_{slow}[k]\rangle_{dB}$ is a fast gain, and $L_{slow}$ is a limit range of a slow gain.

Namely, a slow gain is limited within a range between $-L_{slow}$ and $L_{slow}$.

Likewise, the second limiting part 240 can generate a limited fast gain $G_{fast,L}$ according to the following formula.

$$\langle G_{fast,L}[k]\rangle_{dB} = \max\{\min\{\langle G_{fast}[k]\rangle_{dB}, L_{fast}\}, -L_{fast}\}$$ [Formula 11]

In Formula 11, $\langle G_{fast,L}[k]\rangle_{dB}$ is a limited fast gain, $\langle G_{fast}[k]\rangle_{dB}$ is a fast gain, and $L_{fast}$ is a limit range of a fast gain.

Namely, a fast gain is limited within a range between $-L_{fast}$ and $L_{fast}$.

The first and second limiting parts 230 and 250 are not mandatory and can be omitted if necessary.

Meanwhile, a final gain obtaining part 260 obtains a final normalizing gain G[k] using a limited slow gain and a limited fast gain (occasionally, using a non-limited slow gain and a non-limited fast gain) according to the following formula.

$$G[k]=G_{slow,L}[k]G_{fast,L}[k]$$ [Formula 12]

In Formula 12, G[k] is a final gain, $G_{slow,L}[k]$ is a limited slow gain, and $G_{fast,L}[k]$ is a limited fast gain.

Namely, a final gain can be generated from a combination of a slow gain and a fast gain. In particular, the final gain can be generated from a multiplication of a slow gain and a fast gain. A maximum dynamic range is controlled using a slow gain and a local dynamic range can be controlled using a fast gain.

An output signal generating part 270 modifies input signal using the final gain. For example, the output signal generating part generates an output signal by normalizing the input signal using a final gain.

Meanwhile, a feedback information generating part 280 generates a feedback information including attenuation limit value $\langle L[k]\rangle dB$ using a final gain G[k]. This can be defined as the following formula.

$$\langle L[k]\rangle_{dB} = \min\{-\langle G[k]\rangle_{dB}, 0\}$$ [Formula 13]

In Formula 13, $\langle L[k]\rangle dB$ is an attenuation limit value and G[k] is a final gain for normalizing.

A normalizing gain applied to a TV audio content is smoothed over time to minimize an effect of artifacts attributed to quick variations of slow and fast gains. Yet, as a smoothing time constant needs to be sufficiently small, an overall adaptation of a normalizing unit follows the dynamic of an audio signal. Yet, as a result of non-instant adaptation, a background noise is modulated according to variations of gain. This is annoying especially when a volume of a signal is boosted by the normalizing unit. In other words, when a level of an input signal is too low, if a normalizer raises a level of the input signal as an expander, a level of noise of background is raised together to make the noise heard loudly. Hence, an audio quality is degraded. In order to reduce this effect, the aforesaid noise canceling unit 100 is able to limit the gain filter of noise canceling like Formula 5 using the attenuation limit value shown in the above formula.

Looking into Formula 13, if a final gain has a positive value, an attenuation limit value becomes a negative final gain. If a final gain has a negative value, an attenuation becomes zero. Namely, if a normalizing gain raises a level of an input signal (i.e., if positive), an attenuation limit value becomes a negative final gain. And, a lower limit of a noise gain filter is lowered as many as the corresponding final gain, as shown in Formula 5. If a lower limit is further lowered, cancellation of noise can be further achieved.

Figure 5:
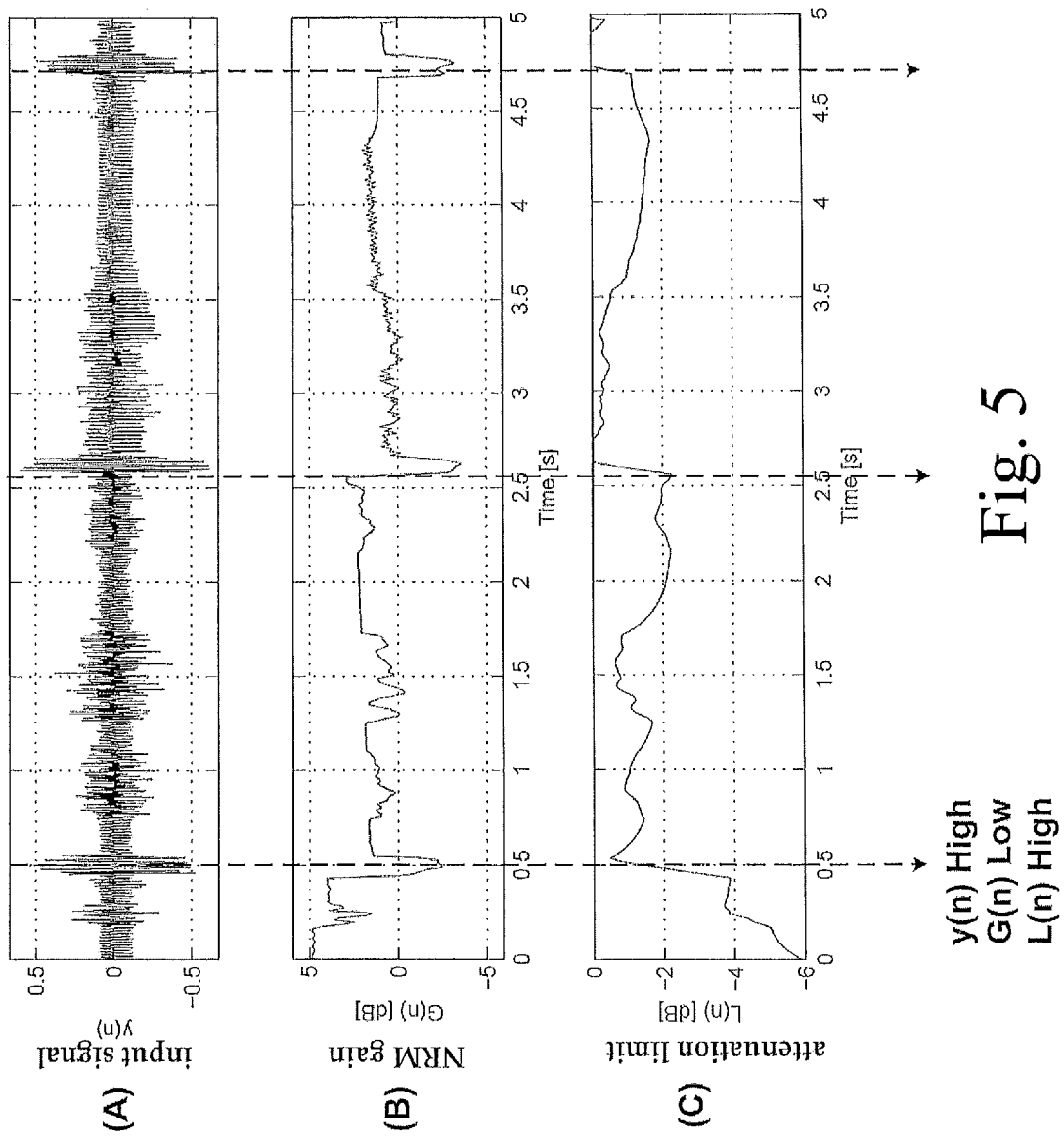
FIG. 5 is a diagram for an example of a normalizing gain and attenuation limit for sample music.

FIG. 5 is a diagram for an example of a normalizing gain and attenuation limit for sample music.

Referring to (A) and (B) of FIG. 5, a music clip y(n) of about 5 seconds and a normalizing gain G(n) corresponding to the music clip y(n) are shown. Since a level of an input signal is high at about 0.5, 2.6 or 4.7 seconds on a time axis, it can be observed that a normalizing gain in this interval is about −2 dB ∼−3 dB, which is low. Meanwhile, it can be observed that a normalizing gain in an interval having a relatively low level is about 0~3 dB, which is relatively high. Meanwhile, referring to (C) of FIG. 5, it can be observed that an attenuation limit value L(n) varies in a range between −6 dB and 0 according to variations of a normalizing gain. In an interval having a relatively high normalizing gain (e.g., interval between 0~0.5 seconds, interval between 1.7~2.6 seconds, etc.), it can be observed that an attenuation limit value is relatively low.

Figure 6:
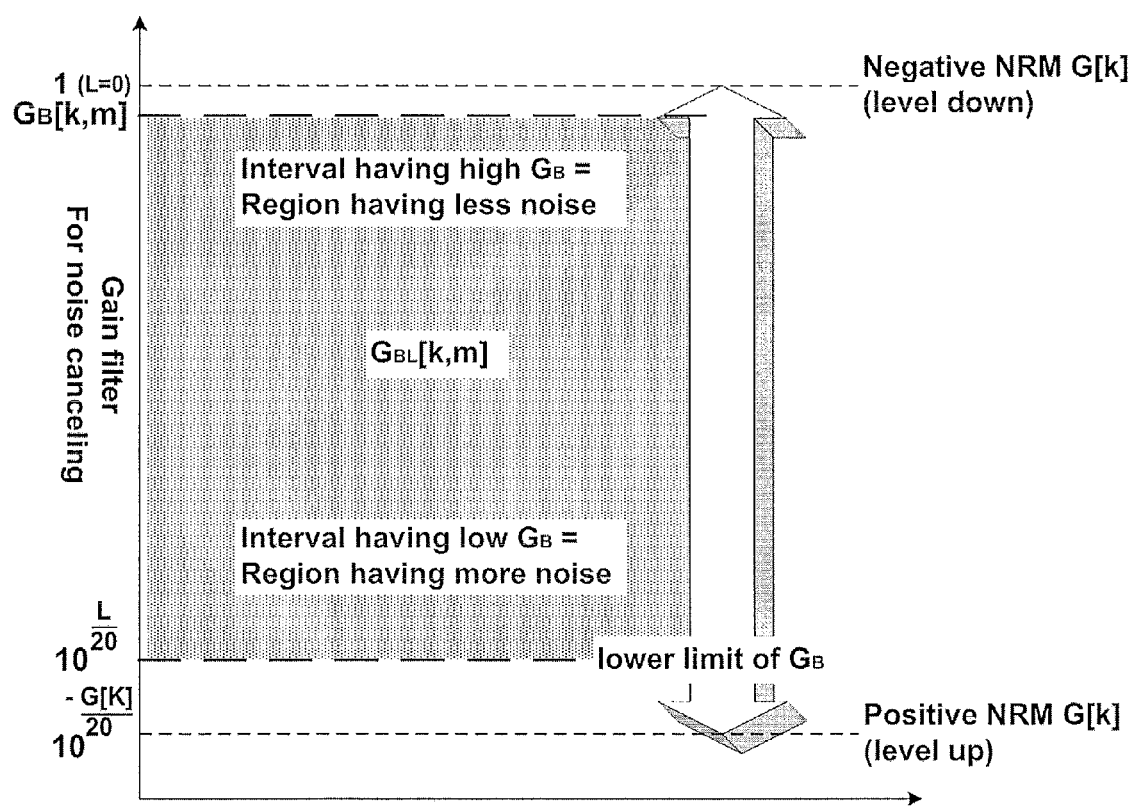
FIG. 6 is a conceptional diagram for the relation between a normalizing gain and an attenuation limit value.

FIG. 6 is a conceptional diagram for the relation between a normalizing gain and an attenuation limit value.

Referring to FIG. 6, first of all, since a range of a gain filter value $G_{BL}$ for noise canceling is between $10^{L/20}$ and GB because a lower limit value is $10^{L/20}$, as shown in Formula 5. $G_B$ has a maximum value if noise is not detected at all. According to Formula 5, a maximum value of $G_B$ can become 1. An interval having a large value of $G_B$ is a region having small noise, while an interval having a $G_B$ value close to a lower limit value is a region having many noises. In this case, the lower limit value ($10^{L/20}$) is not stationary, as mentioned in the foregoing description, but varies from $10^{-G[k]/20}$ to (L=0) according to a normalizing gain G[k]. If a normalizing gain is negative (i.e., if a level of an input signal needs to be lowered), a lower limit of $G_B$ is raised to have noise canceled less. On the contrary, if a normalizing gain is positive (i.e., if a level of an input signal needs to be raised), a lower limit of $G_B$ is lowered to have noise canceled more. In other words, in case that a level of an input signal is considerably raised in a normalizing process, noise can be canceled more by further lowering a lower limit value of a gain applied in a noise canceling process. On the contrary, in case that a level of an input signal is lowered in a normalizing process, it is able to prevent noise from excessively canceled by raising a lower limit value of a gain in a noise canceling process.

The former description relates to one embodiment of the present invention including a noise canceling unit and a normalizing unit. In the following description, another embodiment of the present invention including a volume controlling unit and other units (a noise detecting unit, etc.) is explained.

Figure 7:
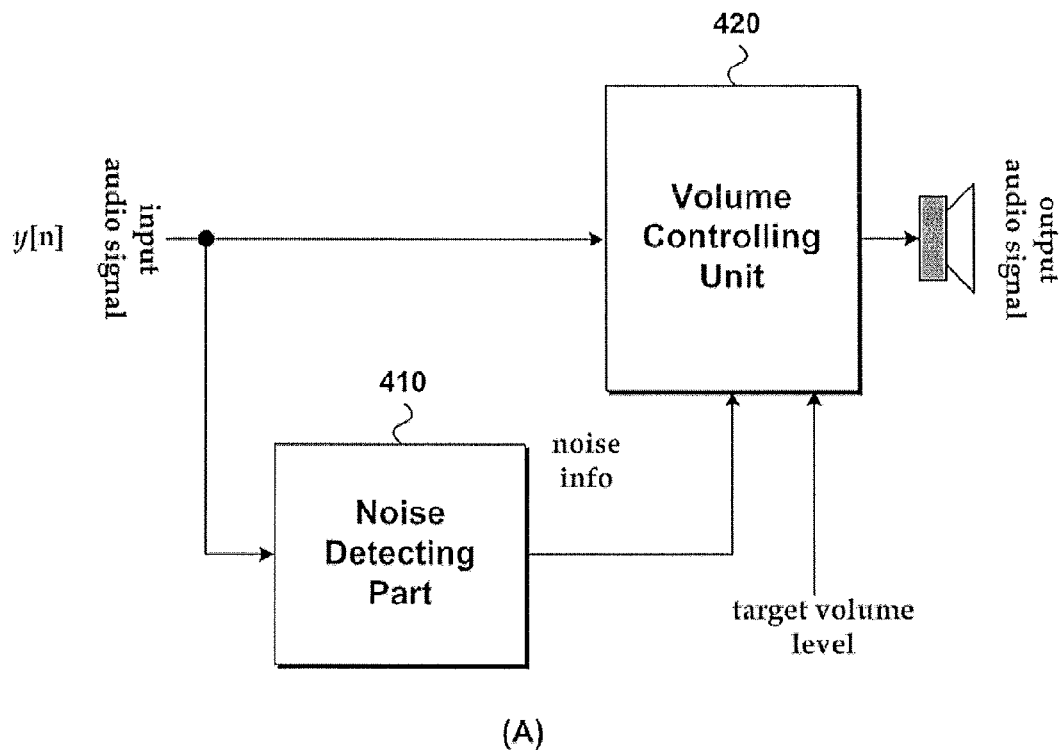
FIG. 7 is a diagram for first and second examples of an audio signal processing apparatus according to another embodiment of the present invention.
Figure 7:
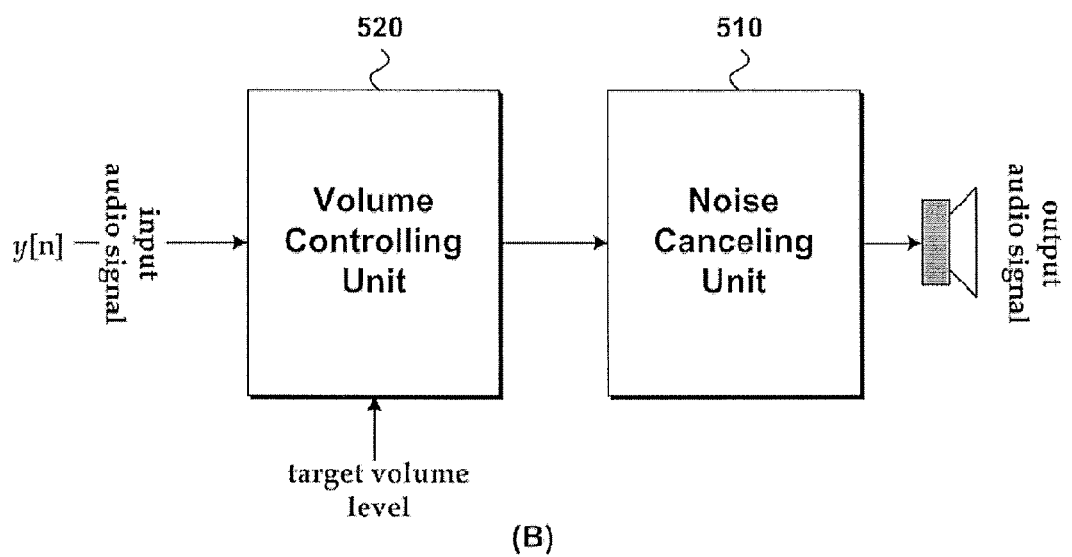
Figure 8:
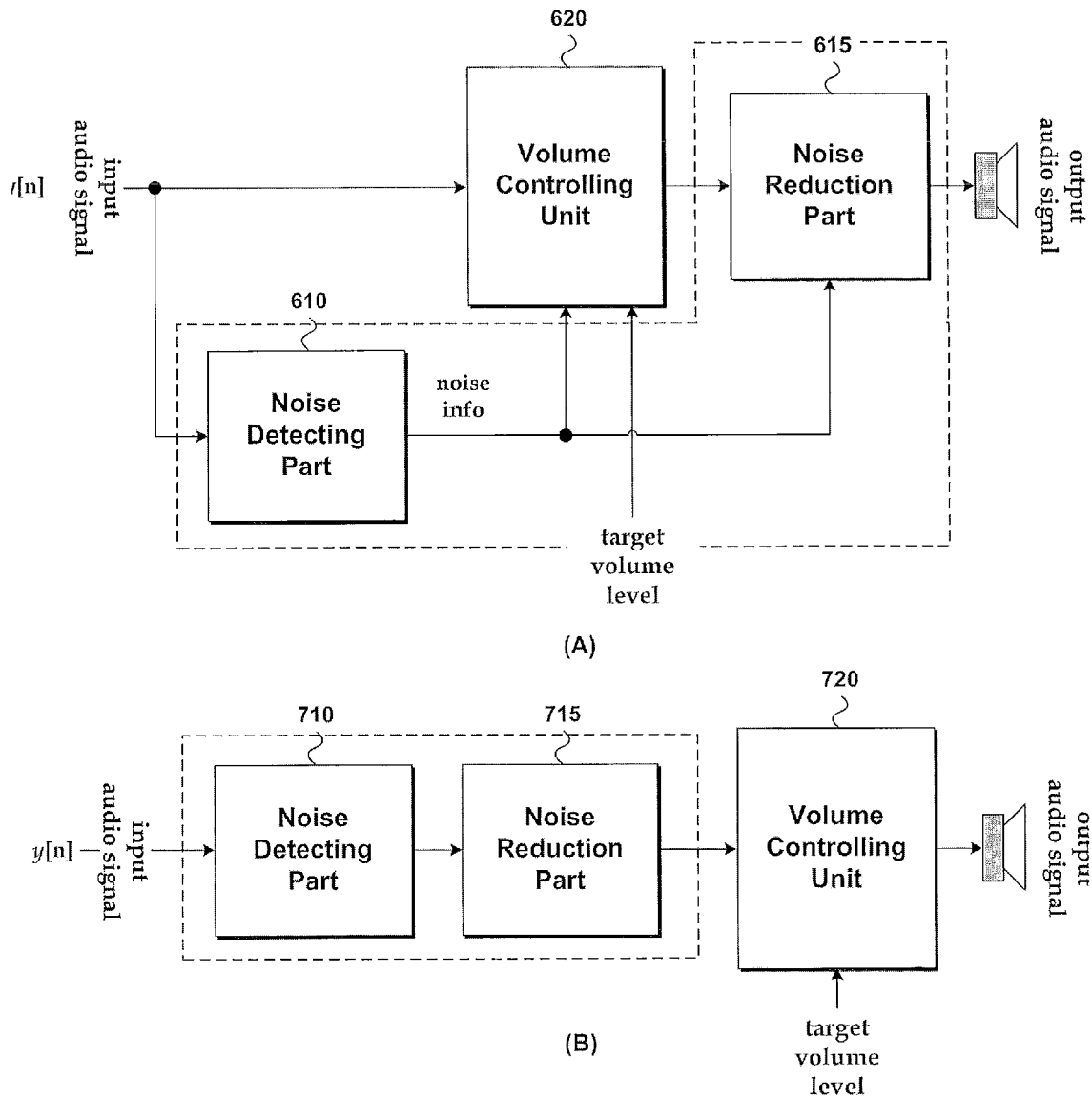
FIG. 8 is a diagram for third and fourth examples of an audio signal processing apparatus according to another embodiment of the present invention.

FIG. 7 is a diagram for first and second examples of an audio signal processing apparatus according to another embodiment of the present invention, and FIG. 8 is a diagram for third and fourth examples of an audio signal processing apparatus according to another embodiment of the present invention.

Referring to a first example shown in (A) of FIG. 7, an audio signal processing apparatus includes a noise detecting part 410 and a volume controlling unit 420. The noise detecting part 410 analyses an input signal to detect an extent of noise included in the input signal per time and per frequency band and then outputs the corresponding information as noise information. A method of detecting the noise may be equal to that of the noise detecting part 130 explained in the foregoing description with reference to FIG. 2. In this case, the noise information can include an estimation $|\tilde{V}[k,m]|^2$ of a power spectrum of a noise signal, which is explained with reference to FIG. 2 or may correspond to a per-time per-frequency band gain filter ($G_{BL}$). In this case, as mentioned in the foregoing description with reference to FIG. 2, a lower limit value of the gain filter may be determined using the attenuation limit information received from the normalizing unit.

Meanwhile, the volume controlling unit 420 controls a volume using the noise information received from the noise detecting part 410 and a target volume level received from a user input. For example, in controlling the volume, it is able to prevent a noise component from being heard by listener's ears abnormally and loudly. And, it is also able to prevent a level of a noise output from fluctuating. After an input signal has been analyzed, if a current input signal is a noise component, it is compared to a case of a normal tone component and another volume level scheme is then applicable. Details of the volume controlling unit 420 will be explained with reference to FIG. 9 later.

Thus, the first example corresponds to an example of detecting a noise and then using the corresponding result for a volume control. And, the second example corresponds to an example of canceling a noise after completion of a volume control. Referring to (B) of FIG. 7, a volume controlling unit 520 controls a volume based on a target volume level for an input signal. The volume controlled signal is sent to the noise canceling unit 510. The noise canceling unit 510 detects a noise signal and then generates a clean signal by removing the noise signal from the volume controlled signal using the corresponding result.

Meanwhile, the noise canceling unit 510 is ale to have the same element of the former noise canceling unit 100 described with reference to FIG. 1 and FIG. 2. In particular, it is able to determine a lower limit value of a gain filter for noise canceling using attenuation limit information received from a normalizing unit.

Referring to (A) of FIG. 8, a third example of an audio signal processing apparatus according to another embodiment of the present invention is shown. Like the former noise detecting part 410 of the first example, a noise detecting part 620 analyzes a noise component of an input signal, generates noise information based on this analysis, and then delivers the generated noise information to a volume controlling unit 620 and a noise reduction part 615. Like the former volume controlling unit 420 of the first example, the volume controlling unit 620 controls a volume of an input signal based on a target volume level and the noise information. The noise reduction part 615 generates a clean signal by canceling or reducing the noise from a volume adjusted output based on the noise information. Meanwhile, the noise detecting part 610 and the noise reduction part 615 may perform the same function of the noise canceling unit 510 of the second example but may differ from the noise canceling unit 510 of the second example in a target of the noise detecting. In particular, a target of noise detecting is an input signal itself in case of the third example. In case of the second example, a target of noise detecting is a volume control completed signal. In case of the third example, the noise reduction part 615 is able to use a gain filter limited by an attenuation limit like the case of the noise canceling unit described with reference to FIG. 2.

Referring to (B) of FIG. 8, an audio signal processing apparatus according to another embodiment of the present invention is shown. In case of a fourth example, both noise detecting and noise reduction are performed before volume controlling. A noise detecting part 710 detects a noise signal from an input signal. A noise reduction part 710 removes the detected noise signal. A volume controlling unit 720 controls a volume of the noise canceled signal based on a target volume level. In this case, the noise detecting part 710 and the noise reduction part 715 can perform the same function of the former noise canceling unit 100 explained with reference to FIG. 1. And, the volume controlling unit 720 can perform the same function of the former volume controlling unit 300 described with reference to FIG. 1.

Figure 9:
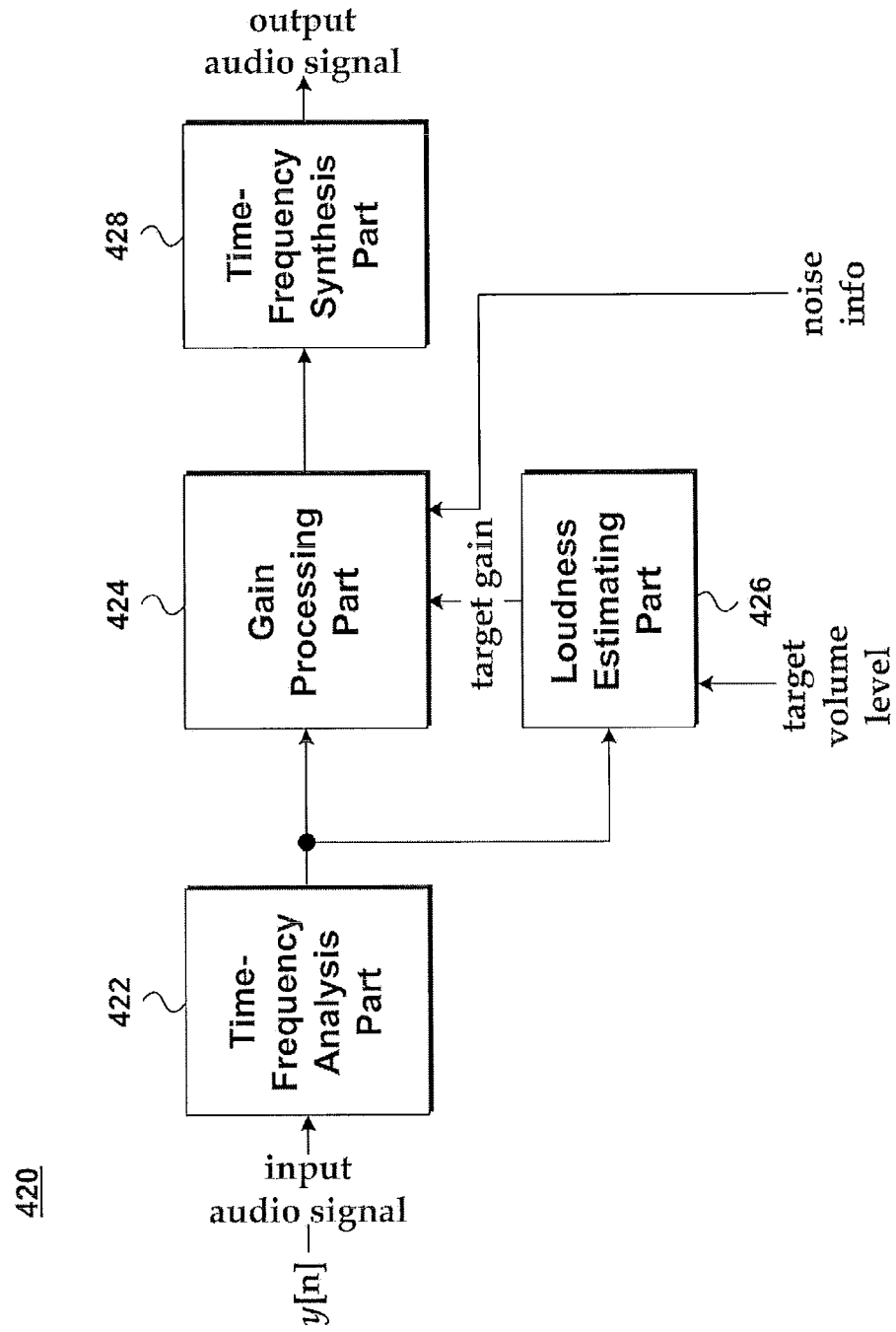
FIG. 9 is a detailed block diagram of a volume controlling unit shown in FIG. 7 or FIG. 8.

FIG. 9 is a detailed block diagram of a volume controlling unit 420/520/620/720 shown in FIG. 7 or FIG. 8.

The volume controlling unit 420 is an element for controlling a volume of an input signal based on a target volume level. And, the volume controlling unit 420 is able to include a time-frequency analysis part 422, a gain processing part 424, a loudness estimating part 426 and a time-frequency synthesis part 428. In case that an input signal is a signal in a time domain, the time-frequency analysis part 422 generates a signal in a frequency domain by performing frequency transform. In this case, the frequency transform can be performed by ERB (equivalent rectangular bandwidth) frequency scale, by which the present invention is non-limited.

The loudness estimating part 426 estimates a loudness of sound by performing a perceptual (psychoacoustic) loudness analysis on an input signal and generates a target gain value from the loudness. In this case, the loudness is an auditory sense actually perceived by a man for each sound pressure level and has a concept (unit of phon) of representing a sound intensity of sound actually recognized by a human ear. In particular, the loudness has the concept discriminated from a sound intensity (unit of dB) determined by a sound pressure level. And, the loudness depends on a lasting time of sound, an occurring time of sound, a spectrum characteristic and the like as well as the sound intensity. Perceptual loudness analysis is to analyze loudness of an input signal based on an equal loudness curve which is the result of a human test. Thus, if loudness per frequency band is obtained, a target gain is obtained based on the loudness and a target volume level. In this case, the target volume level is a full-band gain corresponding to a user inputted volume command or device setting information and may equal to the former target level value explained together with the former embodiment. The target gain is a target value of volume in consideration of loudness and may include a value that varies per frequency band. Meanwhile, the target gain can be re-adjusted to raise a sound quality.

The gain processing part 424 applies the target gain to the frequency transformed input signal. The time-frequency synthesis part 426 frequency-synthesizes the gain processed signal.

Figure 10:
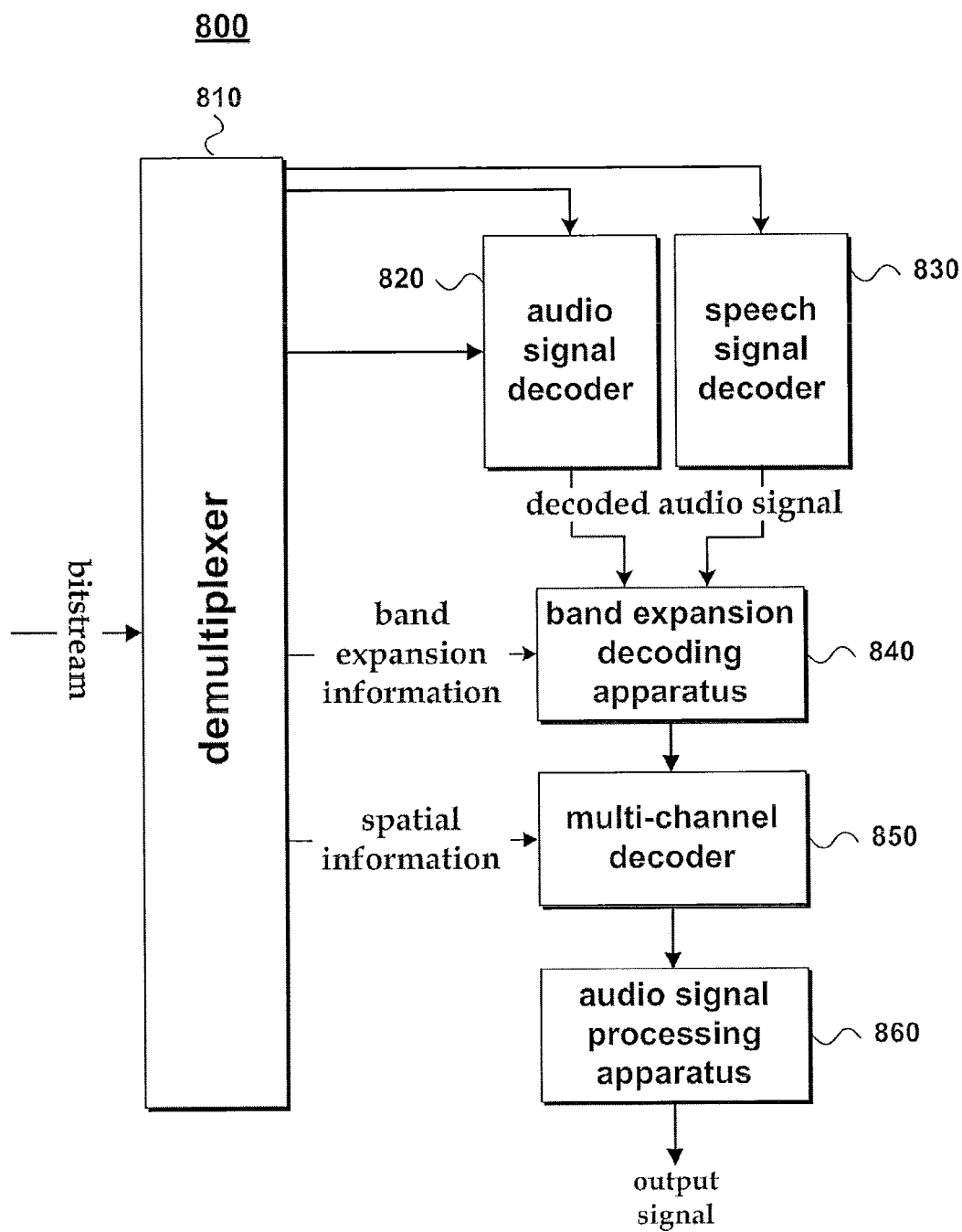
FIG. 10 is a block diagram of an audio signal decoding apparatus to which an audio signal processing apparatus according to an embodiment of the present invention is applied.

FIG. 10 is a block diagram of an audio signal decoding apparatus according to an embodiment of the present invention.

Referring to FIG. 10, an audio signal decoding apparatus 800 can include a demultiplexer 810, an audio signal decoder 820, a band extension decoder 830, a band expansion decoding apparatus 840 and a multi-channel decoder 850. And, the audio signal decoding apparatus 860 further includes an audio signal processing apparatus 860 according to the present invention. The audio signal processing apparatus 860 corresponds to one embodiment of the former audio signal processing apparatus described with reference to FIG. 1 or can correspond to another embodiment (first to fourth examples) of the former audio signal processing apparatus described with reference to FIG. 7 or FIG. 8.

The demultiplexer 810 extracts spectral data, band expansion information, spatial information and the like from an audio signal bitstream.

The audio signal decoder 820 decodes the spectral data by an audio coding scheme if the spectral data corresponding to a downmix signal has a large audio characteristic. In this case, as mentioned in the foregoing description, the audio coding scheme can follow AAC standard, HE-AAC standard or the like. Meanwhile, the audio signal decoder 820 reconstructs a frequency transformed residual by performing dequantization on the spectral data and scale factor carried on the bitstream. Subsequently, the audio signal decoder 820 generates a residual (inverse transformed) by performing inverse frequency transform on the frequency transformed residual.

The speech signal decoder 830 decodes the downmix signal by a speech coding scheme if the spectral data has a large speech characteristic. In this case, as mentioned in the foregoing description, the speech coding scheme can follow the AMR-WB (adaptive multi-rate wide-band) standard, by which the present invention is non-limited.

The band expansion decoder 840 decodes a band extension information bitstream and then generates an audio signal (or, spectral data) of another band (e.g., high frequency band) from a portion or all of the audio signal (or, spectral data) using this information.

If the decoded audio signal is a downmix, the multi-channel decoder 850 generates an output channel signal of a multi-channel signal (stereo signal included) using the spatial information.

As mentioned in the foregoing description, the audio signal processing apparatus 860 is the former audio signal processing apparatus according to an embodiment of the present invention described with reference to FIG. 1, FIG. 7 or FIG. 8. And, the audio signal processing apparatus 860 performs such processing as noise canceling, normalizing, volume controlling and the like on the output channel signal from the multi-channel decoder.

The audio signal processing apparatus according to the present invention is available for various products to use. Theses products can be grouped into a stand alone group and a portable group. A TV, a monitor, a settop box and the like belong to the stand alone group. And, a PMP, a mobile phone, a navigation system and the like belong to the portable group.

Figure 11:
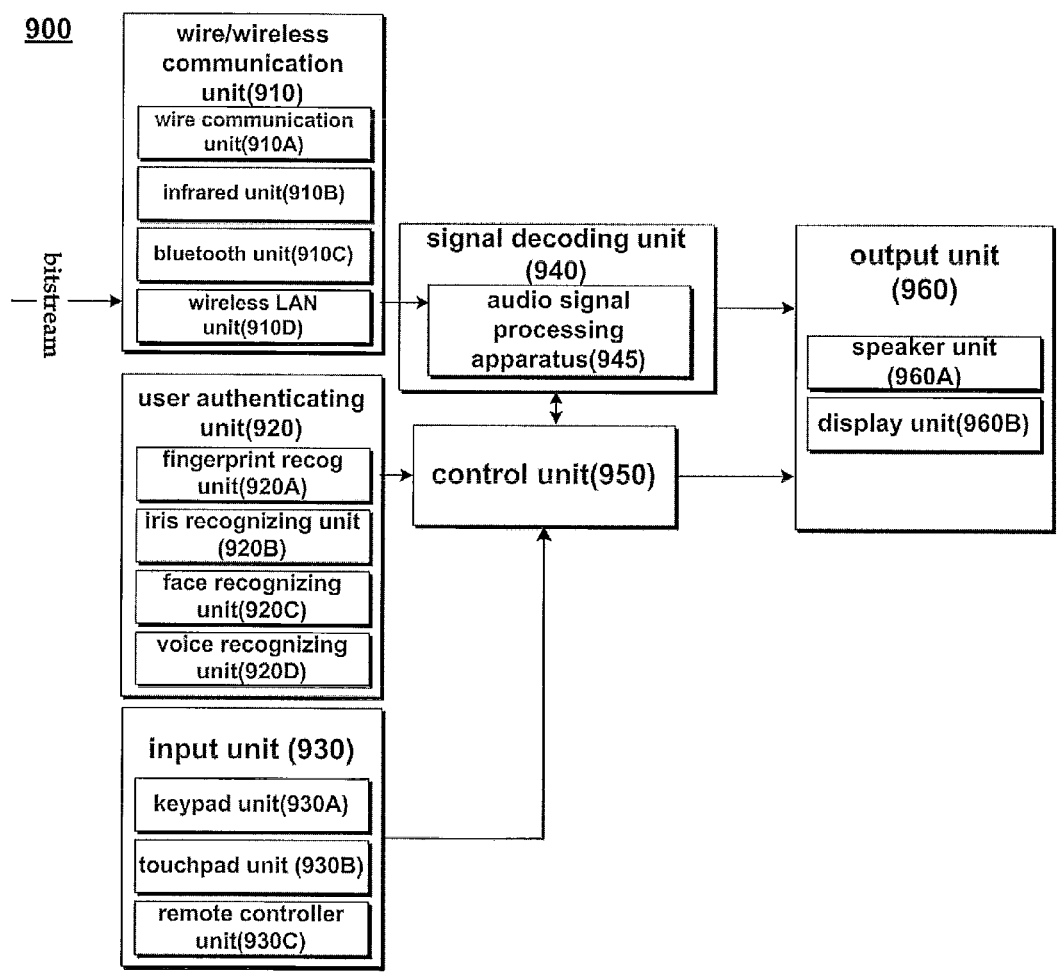
FIG. 11 is a schematic diagram of a product in which an audio signal processing apparatus according to an embodiment of the present invention is implemented.
Figure 12:
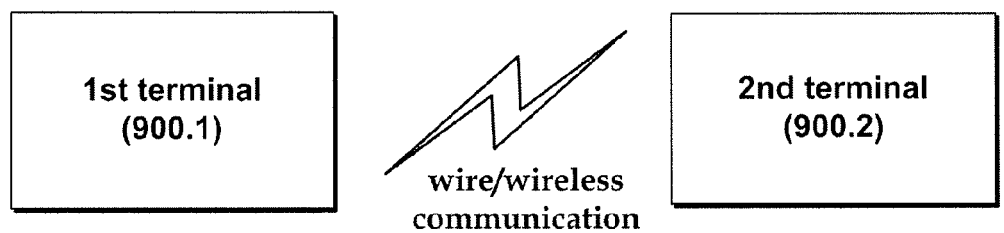
FIG. 12 is a diagram of products provided with an audio signal processing apparatus according to an embodiment of the present invention.
Figure 12:

FIG. 11 is a block diagram of a product in which an audio signal processing apparatus according to an embodiment of the present invention is implemented, and FIG. 12 is a diagram for relations between products in which an audio signal processing apparatus according to an embodiment of the present invention is implemented.

Referring to FIG. 11, a wire/wireless communication unit 910 receives a bitstream via wire/wireless communication system. In particular, the wire/wireless communication unit 910 can include at least one of a wire communication unit 910A, an infrared communication unit 910B, a Bluetooth unit 910C and a wireless LAN communication unit 910D.

A user authenticating unit 920 receives an input of user information and then performs user authentication. The user authenticating unit 920 can include at least one of a fingerprint recognizing unit 920A, an iris recognizing unit 920B, a face recognizing unit 920C and a speech recognizing unit 920D. The fingerprint recognizing unit 920A, the iris recognizing unit 920B, the face recognizing unit 920C and the speech recognizing unit 920D receive fingerprint information, iris information, face contour information and speech information and then convert them into user informations, respectively. Whether each of the user informations matches pre-registered user data is determined to perform the user authentication.

An input unit 930 is an input device enabling a user to input various kinds of commands and can include at least one of a keypad unit 930A, a touchpad unit 930B and a remote controller unit 930C, by which the present invention is non-limited. A signal coding unit 940 performs encoding or decoding on an audio signal and/or a video signal, which is received via the wire/wireless communication unit 910, and then output an audio signal in time domain. The signal coding unit 940 includes an audio signal processing apparatus 945.

As mentioned in the foregoing description, the audio signal processing apparatus 945 corresponds to one of the former audio signal processing apparatuses according to one embodiment and other embodiments (first to fourth examples) of the present invention. And, the audio signal processing apparatus 945 performs such processing as noise canceling, normalizing, volume controlling and the like on an audio signal before being outputted via the output unit. Thus, the audio signal processing apparatus and the signal coding unit including the audio signal processing apparatus can be implemented by at least one or more processors.

A control unit 950 receives input signals from input devices and controls all processes of the signal decoding unit 940 and an output unit 960. In particular, the output unit 960 is an element configured to output an output signal generated by the signal decoding unit 940 and the like and can include a speaker unit 960A and a display unit 960B. If the output signal is an audio signal, it is outputted to a speaker. If the output signal is a video signal, it is outputted via a display.

FIG. 12 shows the relation between the terminal corresponding to the product shown in FIG. 11 and a server.

Referring to (A) of FIG. 12, it can be observed that a first terminal 900.1 and a second terminal 900.2 can exchange data or bitstreams bi-directionally with each other via the wire/wireless communications units.

Referring to FIG. (B) of FIG. 12, it can be observed that a server 1000 and a first terminal 900.1 can perform wire/wireless communication with each other.

An audio signal processing method according to the present invention can be implemented into a computer-executable program and can be stored in a computer-readable recording medium. And, multimedia data having a data structure of the present invention can be stored in the computer-readable recording medium. The computer-readable media include all kinds of recording devices in which data readable by a computer system are stored. The computer-readable media include ROM, RAM, CD-ROM, magnetic tapes, floppy discs, optical data storage devices, and the like for example and also include carrier-wave type implementations (e.g., transmission via Internet). And, a bitstream generated by the above encoding method can be stored in the computer-readable recording medium or can be transmitted via wire/wireless communication network.

Accordingly, the present invention is applicable to processing and outputting an audio signal.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

Accordingly, the present invention provides the following effects and/or advantages.

First of all, as normalizing is adaptively performed on a local dynamic range as well as a maximum dynamic range, the present invention can minimize a damage caused to a sound quality as well as automatically prevents a volume from being excessively raised or lowered.

Secondly, as the extent of noise cancelling is adjusted according to the extent of normalizing, it is able to prevent level of noise from rising together when level of signal is automatically raised by normalizing.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for processing an audio signal, comprising:
receiving, by an audio processing apparatus, a signal, and feedback information estimated based on a normalizing gain;
generating a noise estimation based on the signal;
computing a gain filter for noise canceling, based on the noise estimation and the signal; and,
obtaining a restricted gain filter by applying the feedback information to the gain filter,
wherein the normalizing gain corresponds to a combination of a slow gain and a fast gain,
wherein the slow gain corresponds to a gain for controlling a maximum dynamic range of the signal, and
wherein the fast gain corresponds to a gain for controlling a local dynamic range of the signal.

2. The method of claim 1, further comprising:
generating an output signal by applying the restricted gain filter to the signal,
wherein the normalizing gain is generated based on the output signal and a target level value.

3. The method of claim 1, wherein the gain filter is a time-frequency-variant value associated with a relative proportion of a noise signal in the signal.

4. The method of claim 3, wherein the gain filter and the noise signal are in inverse proportion to each other.

5. An apparatus for processing an audio signal, comprising:
a hardware noise detecting part generating a noise estimation based on a signal; and,
a hardware gain filter computing part computing a gain filter for noise canceling, based on the noise estimation and the signal, the hardware gain filter computing part obtaining a restricted gain filter by applying feedback information to the gain filter,
wherein the feedback information is received from a hardware normalizing part,
wherein the feedback information is estimated based on a normalizing gain,
wherein the normalizing gain corresponds to a combination of a slow gain and a fast gain,
wherein the slow gain corresponds to a gain for controlling a maximum dynamic range of the signal, and
wherein the fast gain corresponds to a gain for controlling a local dynamic range of the signal.

6. The apparatus of claim 5, further comprising:
a multiplier generating an output signal by applying the restricted gain filter to the signal,
wherein the normalizing gain is generated based on the output signal and a target level value.

7. The apparatus of claim 5, wherein the gain filter is a time-frequency-variant value associated with a relative proportion of a noise signal in the signal.

8. The apparatus of claim 7, wherein the gain filter and the noise signal are in inverse proportion to each other.

9. A non-transitory computer-readable medium having instructions stored thereon, which, when executed by a processor, causes the processor to perform operations, comprising:
receiving, by an audio processing apparatus, a signal, and feedback information estimated based on a normalizing gain;
generating a noise estimation based on the signal;
computing a gain filter for noise canceling, based on the noise estimation and the signal; and,
generating a restricted gain filter by applying the feedback information to the gain filter
wherein the normalizing gain corresponds to a combination of a slow gain and a fast gain,
wherein the slow gain corresponds to a gain for controlling a maximum dynamic range of the signal, and
wherein the fast gain corresponds to a gain for controlling a local dynamic range of the signal.

* * * * *